United States Patent [19]

Chiang

[11] Patent Number: 5,329,174
[45] Date of Patent: Jul. 12, 1994

[54] CIRCUIT FOR FORCING KNOWN VOLTAGE ON UNCONNECTED PADS OF AN INTEGRATED CIRCUIT

[75] Inventor: David Chiang, Saratoga, Calif.

[73] Assignee: Xilinx, Inc., San Jose, Calif.

[21] Appl. No.: 965,636

[22] Filed: Oct. 23, 1992

[51] Int. Cl.$^5$ .................... H03K 17/16; H03K 3/26
[52] U.S. Cl. .................. 307/443; 307/482.1; 307/520; 307/550
[58] Field of Search .............. 307/443, 482.1, 303, 307/520, 550, 481, 272.3

[56] References Cited

U.S. PATENT DOCUMENTS

| | | | |
|---|---|---|---|
| 4,577,124 | 3/1986 | Koike | 307/243 |
| 4,700,086 | 10/1987 | Ling et al. | 307/481 |
| 4,843,262 | 6/1989 | Abe | 307/520 |
| 4,990,800 | 2/1991 | Lee | 307/465 |
| 5,036,227 | 7/1991 | Jo et al. | 307/481 |
| 5,065,048 | 11/1991 | Asai et al. | 307/481 |
| 5,151,622 | 9/1992 | Thrower et al. | 307/451 |
| 5,166,561 | 11/1992 | Okura | 307/550 |

FOREIGN PATENT DOCUMENTS 0000965 1/1979 Japan .

Primary Examiner—Edward P. Westin
Assistant Examiner—Richard Roseen
Attorney, Agent, or Firm—Edel M. Young; Norman R. Klivans

[57] ABSTRACT

A feedback circuit for input pads of an integrated circuit where one or more of the input pads may not be bonded to a package pin when the pad is packaged or alternatively is bonded but the pin is not externally connected. The feedback circuit includes a transistor connected between the input pad and the output of the first associated input buffer so that whenever the integrated circuit is at a steady state, i.e. is off or has been powered on, no direct current is drawn by the pad because the unbonded pad is forced to be either in the high or low state by the feedback transistor. The feedback transistor may be a pull down device or a pull up device or a full inverting gate; in any case the feedback device draws no direct current when the input pad connected thereto is at its fully high or fully low state voltage.

11 Claims, 3 Drawing Sheets

CIRCUIT FOR FORCING KNOWN VOLTAGE ON UNCONNECTED PADS OF AN INTEGRATED CIRCUIT

BACKGROUND OF THE INVENTION

1. Field of the Invention

This invention relates to an improvement in integrated circuit bonding pads, and more specifically to a circuit for eliminating stray currents in those integrated circuit bonding pads which are not bonded to a pin in the integrated circuit package or otherwise are not externally connected.

2. Description of the Prior Art

It is often desirable with regard to integrated circuit chips to provide chips (i.e. die) which can be housed in different integrated circuit packages having varying numbers of pins (external terminals). As is well known, integrated circuit packages are available in a variety of standard number of pins. It is often desirable to package a particular type of integrated circuit (IC) die in several packages having different number of pins; for instance a given die may be designed to be housed in both an 84 pin and a 68 pin package. In the latter case, 16 of the die pads on the integrated circuit are left unbonded, i.e. no external connection is made to those pads. If such an unbonded pad is an input pad, which ordinarily would receive signals from the outside, this poses a problem because the voltage at such an inaccessible pad may take on intermediate values (i.e. the input is floating) which in turn causes excessive current to be drawn by the circuitry on the die connected to that pad.

Another problem associated with such an unbonded pad is functional failure of the IC due to intermediate voltage values occurring within the chip which are caused by the unbonded pad. That is to say, such an unbonded pad may provide what appears to be input signals to the chip, which prevent the IC from operating properly. The pad voltage floats by taking on intermediate values due to capacitive coupling from adjacent connected traces on the IC, or slow leakage paths from nearby integrated circuit nodes.

It is a known technique to use a passive electronic device such as a resistor to "pull" the pad voltage of such an unconnected pad either always high or always low if no external signal is provided, i.e. no external drive. The disadvantage of this prior art technique is that direct current is drawn by the passive device even when the pad is driven to high or low voltage.

In prior art FIG. 1 input pad 10 of an integrated circuit is connected to a series of input buffers 12 and 14 which are ultimately connected to the IC logic circuitry. The conventional input buffers (inverters) 12 and 14 are (as is usual) each a pair of transistors, typically field effect transistors one P-channel and one N-channel with their gate terminals connected together and the drain of one transistor connected to the source of the other, providing therefrom the output signal. The other source and drain terminals of the two transistors are connected respectively to a source of voltage and to ground. Connected between pad 10 and the first input buffer 12 is a first terminal of pull down resistor 18 having its second terminal connected as shown to ground. Alternatively the second terminal of resistor 18 is connected to a voltage source, and therefore resistor 18 is a pull up resistor. As can be seen, if pad 10 is driven to a high voltage from an external signal source connected thereto, resistor 18 draws current.

No satisfactory solution therefore is known to this unbonded pad problem in the prior art, without drawing direct current. Drawing direct current is undesirable, especially for instance in battery powered equipment.

SUMMARY OF THE INVENTION

In accordance with the invention an active feedback device such as a field effect transistor forces the voltage of the unbonded pad to be high or low, i.e. to be the voltage of an associated high or low logic signal. The first inverting stage of the input buffer associated with the pad drives the active feedback device by connecting the output of the first stage of the input buffer to the gate terminal of the transistor, with the other two terminals of the transistor, i.e. the drain and source, connected respectively to the input pad and to ground. The characteristics of the feedback transistor are such that for an unbonded pad, the capacitive effects present as described above turn the feedback transistor partially on until the voltage at the pad reaches either a valid high or valid low logic signal voltage state.

The active feedback device is in one embodiment a pull down transistor such that when the gate terminal of the feedback transistor receives a high signal, the feedback transistor is turned on. In this case the feedback transistor is an N-channel MOS transistor having its source terminal connected to ground. Alternatively the feedback device is a pull up transistor that is on when the gate of the transistor receives a low signal, in this case a P-channel MOS transistor having its source terminal connected to the chip power supply voltage. Alternatively, the feedback device may be a full inverting gate, i.e. an inverter.

Note that advantageously (unlike the prior art passive resistor) the active feedback device does not draw any direct current when the voltage of the pad is at either the fully high or fully low logic states; instead current is drawn only transiently during transitions, i.e. transistor switching. Thus current drain is minimized. The feedback transistor (or gate) has a physical active region size and characteristics such that the active current is below some predetermined level (such as 10 microamps) so that an external driver driving the pad encounters negligible speed degradation, in spite of the presence of the feedback device. Therefore the feedback circuit in accordance with the invention may be provided on each input pad of an integrated circuit, including those pads which are to be externally connected. In the latter case, the feedback can be used to force a known voltage on a line that is bonded to a pin which is not connected to an external signal source.

DETAILED DESCRIPTION OF THE INVENTION

Figure 1:
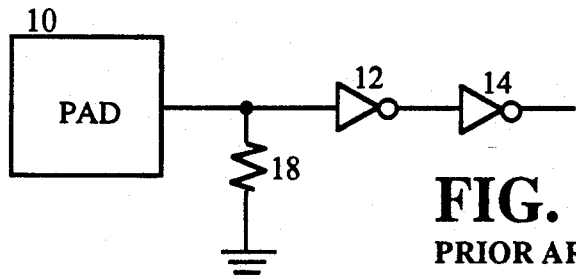
FIG. 1 shows a prior art input buffer circuit.
Figure 2A:
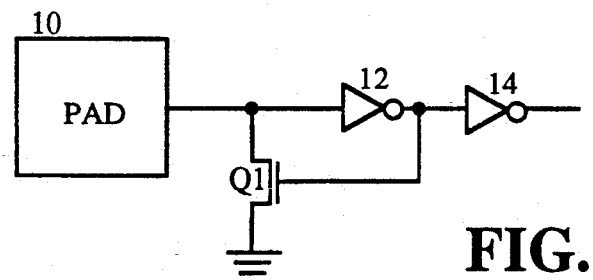
FIGS. 2a, 2b show input buffer circuits in accordance with the invention.

FIG. 2a shows a feedback circuit for an input buffer in accordance with the invention with conventional pad 10 and input buffers 12 and 14 as in FIG. 1. FIG. 2a however, instead of having a passive resistor (as a pull down or pull up device), includes a field effect transistor Q1 connected between the input pad and ground, with its gate (i.e. control terminal) connected to the output terminal of the first input buffer 12. In this case field effect transistor Q1 is a pull down device (N-channel MOS transistor) so that when the signal on its gate is high it shorts pad 10 to ground when transistor Q1 is turned on. This forces pad 10 (if it is an unbonded pad) to a known, i.e. low signal state in this case zero voltage.

Alternatively (see FIG. 2b) the feedback transistor Q3 is a P-channel MOS transistor which instead of having one terminal connected to ground is connected to the chip power supply V. Thus transistor Q3 is turned on when the signal on the gate of transistor Q1 is low.

Figure 3A:
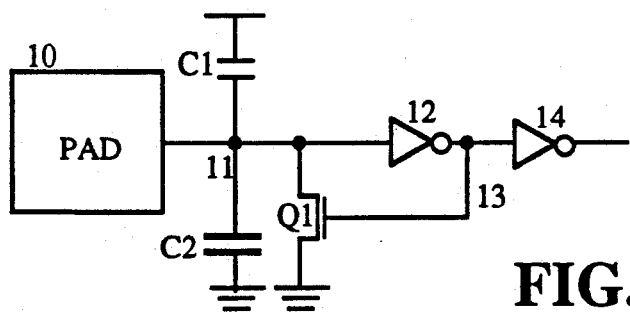
FIGS. 3a, 3b, 3c and 3d show how the circuit of FIG. 2a operates.

Operation on the circuit of FIG. 2a is explained with reference to FIGS. 3a, 3b, 3c and 3d each of which shows the equivalent circuit of FIG. 2a. In FIG. 3a when there is no power supplied to the integrated circuit ($V_{cc}=0$), unbonded pad 10 is at approximately zero potential (0 volts). At this point parasitic capacitance (shown as capacitors C1 and C2) is present. Capacitance C1 is stray capacitance, such as pad-to-pad. Capacitance C2 is caused by the capacitance of the pad 10 over the insulating die substrate and other parasitic capacitors. Capacitance C2 is much larger than capacitance C1, since the pad 10 is physically a relatively large metal area over the insulating substrate.

Figure 3B:
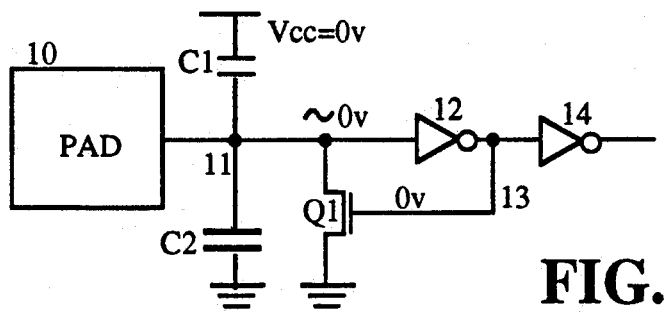

Prior to power up of the integrated circuit, as shown in FIG. 3b, the voltages of all internal nodes are approximately 0 volts.

Figure 3C:
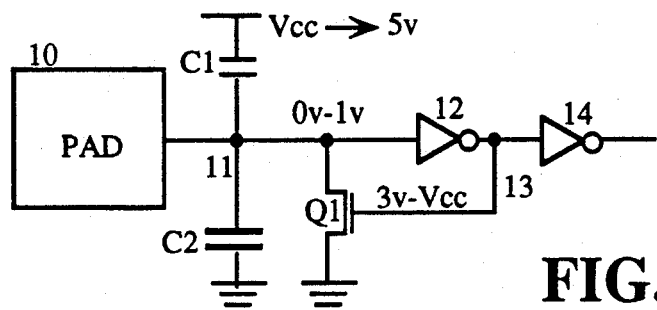

During power up of the integrated circuit as shown in FIG. 3c, the pad 10 voltage is determined by the capacitive divider C1, C2. The pad voltage is close to 0 volts since C2 is substantially larger than C1. The pad voltage is approximately $$V_{pad} \approx V_{cc} \cdot C1/(C1+C2)$$

Since pad 10 serves as a large capacitor C2 to the substrate as explained above, the substrate being at 0 volts i.e. ground, at power up the voltage v1 at pad 10 will rise more slowly than the voltage on node 13 at the output of inverter 12. As the Vcc voltage at node 13 rises above the threshold voltage of transistor Q1, transistor Q1 will turn fully on, pulling node 11 to ground.

Figure 3D:
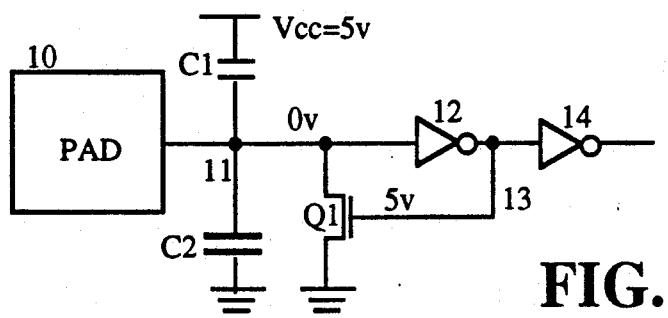

Finally, as shown in FIG. 3d, after power up, when Vcc has reached 5 volts, the circuit achieves steady state operation. Given the proper characteristics for transistor Q1, the pad voltage 10 is low enough to completely turn on feedback transistor Q1. Transistor Q1 will discharge, i.e. ground, pad 10 so that the signal at pad 10 is 0 volts and the output at node 13 from the first input buffer stage 12 is high, i.e. approximately 5 volts. Thus the feedback device Q1 remains on as long as the circuit is in its steady state so as to fully discharge the pad voltage, i.e. reduce the pad voltage to 0. Thus in the steady state, pad 10 is at a valid (low in this embodiment) voltage and no DC current is drawn by inverter 12. In summary, as long as the initial conditions immediately after powerup cause Q1 to be at least partially in the "on" state, the pad 10 will be discharged to 0 volts.

The drive capability of the feedback device Q1 is made sufficiently weak by selecting its transistor characteristics so that only a small current (10 microamps for instance, which is on the order of the junction leakage current) is drawn by transistor Q1 even when it is on. Therefore an external drive signal supplied to pad 10 easily overpowers the feedback device Q1, without degrading the performance of the IC. A weak transistor Q1 is necessary in case pad 10 happens to be a bonded pad. Such compatibility is necessary since (as described above) typically integrated circuit die which will use this feature are intended for use both where a particular pad is bonded (in a high pin count package) and unbonded (in a lower pin count package). Therefore compatibility of the unbonded pad to a external driver, i.e. when the pad is actually bonded, is essential.

Figure 2B:
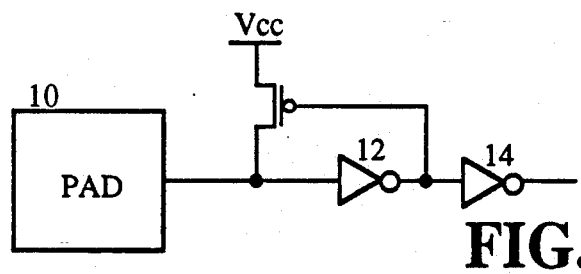

It is to be understood that the circuit of FIG. 2b operates similarly to that of FIG. 2a, except that the pad is charged by the feedback device to the chip supply voltage rather than discharged to 0 V.

Figure 4A:
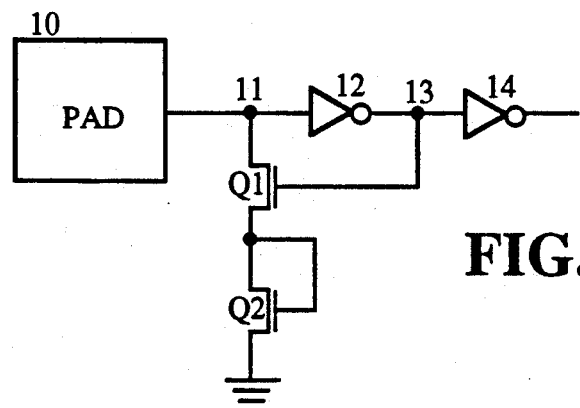
FIGS. 4a, 4b show two versions of a third embodiment of an input buffer circuit in accordance with the invention.

Another embodiment in FIG. 4a includes as before pad 10, input buffers 12 and 14, and feedback transistor Q1. Additionally there is a second feedback transistor Q2 connected between pad 10 and transistor Q1. This circuit allows faster operation because Q1 may then be made minimum size (even smaller than the size of Q1 in the circuit of FIG. 2a) so as not to capacitively load down input buffer 12 while the current adjustments of the feedback path may be made by providing transistor Q2 of a proper size.

Transistor Q2 is of a size to draw no more than 10 microamps, for instance when $V_{pad}$ is 2.5 volts. Thus Q2 would have an on-resistance of 250KΩ. It is to be understood that a resistor could be substituted, to the extent this is practical, for transistor Q2, and would serve as a load element for transistor Q1.

Figure 4B:
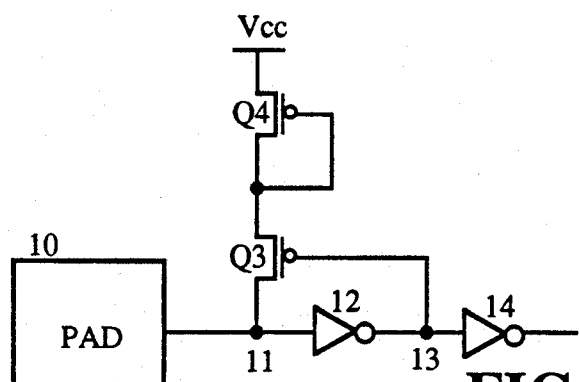

FIG. 4b shows another version of the circuit of FIG. 2b, with the addition of transistor Q4 (a load element) connected to the chip power supply V. This circuit could in another version have a resistor substituted for transistor Q4.

It is to be understood that in FIG. 4a, transistors Q1 and Q2 may be either FET's, bipolar transistors, or other types of transistors. Similarly, in FIG. 2a transistor Q1 could be a bipolar transistor.

Figure 5:
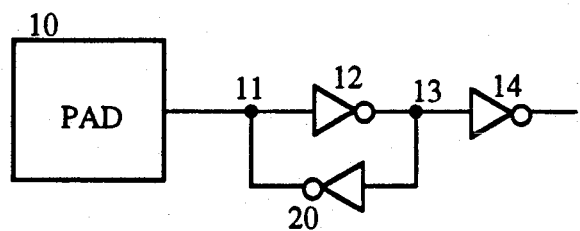
FIG. 5 shows a fourth embodiment of an input buffer circuit in accordance with the invention.

In another version shown in FIG. 5, in place of feedback transistor Q1, conventional inverting gate 20 (including conventionally an N-channel and P-channel transistor pair) is connected between pad 10 and the output 13 of input buffer 12. This provides the same feedback effect as described above, however requiring two transistors.

The above description of the invention is illustrative and not limiting; further modifications will be apparent to one of ordinary skill in the art in the light of this disclosure and is intended to fall within the scope of the appended claims. For example, although the invention is described in connection with a pad, the same circuit will protect other internal points having high capacitance which may in some applications be floating.

I claim:

1. A circuit for forcing a terminal of an integrated circuit to a known voltage, comprising:
    a buffer having its input terminal connected to the integrated circuit terminal; and a feedback device connected between the integrated circuit terminal and an output terminal of the buffer, said feedback device drawing a small current below a predetermined level wherein an external driver driving the terminal overpowers the feedback device.

2. The circuit of claim 1, wherein the feedback device is a first transistor having its control terminal connected to the output terminal of the buffer, a second of its terminals connected to the integrated circuit terminal, and a third terminal connected to a voltage supply.

3. The circuit of claim 2, wherein the transistor is a field effect transistor and the voltage supply is the voltage supply of the integrated circuit.

4. The circuit of claim 2, further comprising a second transistor connected between the third terminal of the first transistor and the voltage supply, wherein a control terminal and a second terminal of the second transistor are both connected to the third terminal of the first transistor, and the third terminal of the second transistor is connected to the voltage supply.

5. The circuit of claim 2, further comprising a load element connected between the third terminal of the first transistor and the voltage supply.

6. The circuit of claim 1, further comprising an integrated circuit package for housing the integrated circuit and having a plurality of pins, and wherein the integrated circuit terminal is a bonding pad of the integrated circuit and is not connected to any pin of the package.

7. The device of claim 1, wherein the feedback device is an inverter having its input terminal connected to the output terminal of the buffer and having its output terminal connected to the integrated circuit terminal.

8. The circuit of claim 1, wherein the feedback device draws a current of less than 10 microamps when it is on.

9. A method of forcing a pad not connected to an external signal source of an integrated circuit die to a known voltage, comprising the steps of:
   connecting a buffer to the pad; and
   feeding back an output signal on an output terminal of the buffer to the pad by connecting an active device between the output terminal and the pad, said active device drawing a small current below a predetermined level wherein an external driver driving the pad overpowers the active device.

10. A circuit for forcing a terminal of an integrated circuit to a known voltage comprising:
   a buffer having its input terminal connected to the integrated circuit terminal;
   a first transistor having its control terminal connected to the output terminal of the buffer, a second of its terminals connected to the integrated circuit terminal, and a third terminal; and
   a second transistor connected between the third terminal of the first transistor and a voltage supply, wherein a control terminal and a second terminal of the second transistor are both connected to the third terminal of the first transistor, and the third terminal of the second transistor is connected to the voltage supply.

11. A circuit for forcing a terminal of an integrated circuit to a known voltage comprising:
   a buffer having its input terminal connected to the integrated circuit terminal;
   a first transistor having its control terminal connected to the output terminal of the buffer, a second of its terminals connected to the integrated circuit terminal, and a third terminal; and
   a load element connected between the third terminal of the first transistor and a voltage supply.

* * * * *